United States Patent
Kao et al.

(10) Patent No.: US 8,174,039 B2
(45) Date of Patent: May 8, 2012

(54) LIGHT-EMITTING DIODE DEVICE WITH HIGH LUMINESCENT EFFICIENCY

(75) Inventors: Lin-Chieh Kao, Caotun Town (TW); Shu-Ying Yang, Gangshan Town (TW)

(73) Assignee: HUGA Optotech Inc., Taichung (TW)

( * ) Notice: Subject to any disclaimer, the term of this patent is extended or adjusted under 35 U.S.C. 154(b) by 17 days.

(21) Appl. No.: 12/418,079

(22) Filed: Apr. 3, 2009

(65) Prior Publication Data
US 2010/0193811 A1 Aug. 5, 2010

(30) Foreign Application Priority Data
Feb. 5, 2009 (TW) .............................. 98103746 A

(51) Int. Cl.
*H01L 33/00* (2010.01)

(52) U.S. Cl. .......................................... 257/98; 257/99

(58) Field of Classification Search ................ 257/98, 257/99
See application file for complete search history.

(56) References Cited

U.S. PATENT DOCUMENTS

| | | | |
|---|---|---|---|
| 7,126,975 B2 * | 10/2006 | Iwasaki et al. ................ | 372/69 |
| 7,129,514 B2 * | 10/2006 | Okuyama et al. .............. | 257/13 |
| 2002/0076904 A1 * | 6/2002 | Imler ............................ | 438/462 |
| 2003/0141507 A1 * | 7/2003 | Krames et al. ................. | 257/79 |
| 2007/0126013 A1 * | 6/2007 | Kim et al. ...................... | 257/91 |
| 2008/0061308 A1 * | 3/2008 | Yoon ............................. | 257/94 |
| 2008/0135864 A1 * | 6/2008 | David et al. .................... | 257/98 |
| 2010/0177384 A1 * | 7/2010 | Peroz et al. .................... | 359/487 |

* cited by examiner

*Primary Examiner* — Wai Sing Louie
*Assistant Examiner* — Bilkis Jahan
(74) *Attorney, Agent, or Firm* — Jianq Chyun IP Office

(57) ABSTRACT

The invention discloses a light-emitting diode including a substrate, a main stack structure, a plurality of secondary pillars, a transparent insulating material, a transparent conducting layer, a first electrode and a second electrode. The pillars are formed on the substrate and surrounding the main stack structure. The main stack structure and each of the pillars has a first conducting-type semiconductor layer, a luminescing layer, and a second conducting-type semiconductor layer formed on the substrate in sequence. The transparent insulating material fills the gaps between the pillars and is as high as the pillars. The transparent conducting layer is coated on the main stack, the pillars and the transparent insulating material. The first electrode is formed on the transparent conducting layer and second electrode is formed on the first conducting-type semiconductor layer.

12 Claims, 11 Drawing Sheets

LIGHT-EMITTING DIODE DEVICE WITH HIGH LUMINESCENT EFFICIENCY

BACKGROUND OF THE INVENTION

1. Field of the Invention

The present invention relates to a light-emitting diode and a fabricating method thereof, and more particularly, the present invention relates to a light-emitting diode with high luminescent efficiency and the fabricating method thereof.

2. Description of the Prior Art

So far, light-emitting diodes have been broadly applied to various products such as key switch systems, back-light modules of mobile phones, lighting systems of vehicles, light bulbs for decorations, and remote controls, etc. In order to make sure light-emitting diodes have properties of high reliability and low energy consumption, the luminescent efficiency of a light-emitting diode is regarded as one of the most important items.

Please refer to FIG. 1 which is a cross-sectional view illustrating a conventional light-emitting diode. The conventional light-emitting diode 1 including a substrate 10, an N-type gallium nitride layer 11, a luminescing layer 12, a P-type gallium nitride layer 13, and electrodes 14, 15. The conventional light-emitting diode 1 operates by means of conducting the P-type gallium nitride layer 13 and the N-type gallium nitride layer 11. The electrode 15 is formed on the P-type gallium nitride layer 13 and the electrode 14 is formed on the N-type gallium nitride layer 11.

Generally, the luminescent efficiency of a light-emitting diode is relative to its inner quantum efficiency and light-extraction efficiency. So-called inner quantum efficiency is determined by the characteristics and properties of a material. As for light-extraction efficiency, it means the ratio of radiation emitted from the inner light-emitting diode to the surrounding air or the surrounding epoxy resin packaging the light-emitting diode. Although light-emitting diodes with various structures have been brought up by now, how to fully improve the light-extraction efficiency and the luminescent efficiency of a light-emitting diode is still an important issue.

SUMMARY OF THE INVENTION

Accordingly, an aspect of the present invention is to provide a light-emitting diode with high luminescent efficiency.

According to the first embodiment of the invention, the light-emitting diode includes a substrate, a main stack structure, a plurality of secondary pillars, a transparent insulating layer, a transparent conducting layer, a first electrode and a second electrode.

The main stack structure is formed on the substrate, and the plurality of secondary pillars is formed on the substrate and surrounds the main stack structure. The stack structure and each of the plurality of pillars respectively has a first conducting-type semiconductor layer, a luminescing layer, and a second conducting-type semi-conductor layer formed on the substrate in sequence.

The transparent insulating layer fills the gaps between the pillars and is substantially as high as the pillars. The transparent conducting layer is coated on the main stack structure, the plurality of pillars, and the transparent insulating layer. The first electrode is formed on the transparent conducting layer. The second electrode is formed on the first conducting-type semiconductor layer.

Another aspect of the present invention is to provide a light-emitting diode with high luminescent efficiency.

According to the second embodiment of the invention, the light-emitting diode includes a substrate, a main stack structure, a plurality of secondary pillars, a continuous transparent insulating layer, a continuous transparent conducting layer, a first electrode, and a second electrode.

The main stack structure is formed on the substrate, and the plurality of secondary pillars is formed on the substrate and surrounding the main stack structure. The stack structure and each of the plurality of pillars respectively has a first conducting-type semiconductor layer, a luminescing layer, and a second conducting-type semi-conductor layer formed on the substrate in sequence. The continuous transparent insulating layer is coated on the upper surface of the first conducting-type semiconductor layer of the plurality of pillars, the side surface of the main stack structure, and the side surface of the plurality of pillars to make the second conducting-type semiconductor layers of the main stack structure and that of each of the pillars uncovered. The continuous transparent conducting layer is coated on the transparent insulating layer and the second conducting-type semiconductor layers of the main stack structure and that of each of the plurality of pillars to make the main stack structure and the plurality of pillars conducted to each other. The first electrode is formed on the transparent conducting layer. The second electrode is formed on the first conducting-type semiconductor layer.

Compared to the prior art, the light-emitting diode of the invention includes the plurality of pillars as mentioned above, therefore the light-extraction efficiency of the light-emitting diode is improved. Furthermore, filling the transparent insulating layer with high refractive index into the gaps between the pillars could not only decrease the total reflection phenomenon of the light in the light-emitting diode but also increase the fracture resistance of the device. Otherwise, the pillars are coated with the transparent conducting layer, which makes the driving current of the light-emitting diode to flow to the pillars to promote the luminescing layers of the pillars to luminesce without losing the luminescing area of the pillars.

The objective of the present invention will no doubt become obvious to those of ordinary skill in the art after reading the following detailed description of the preferred embodiment, which is illustrated in the various figures and drawings.

BRIEF DESCRIPTION OF THE APPENDED DRAWINGS

DETAILED DESCRIPTION OF THE INVENTION

Figure 1:
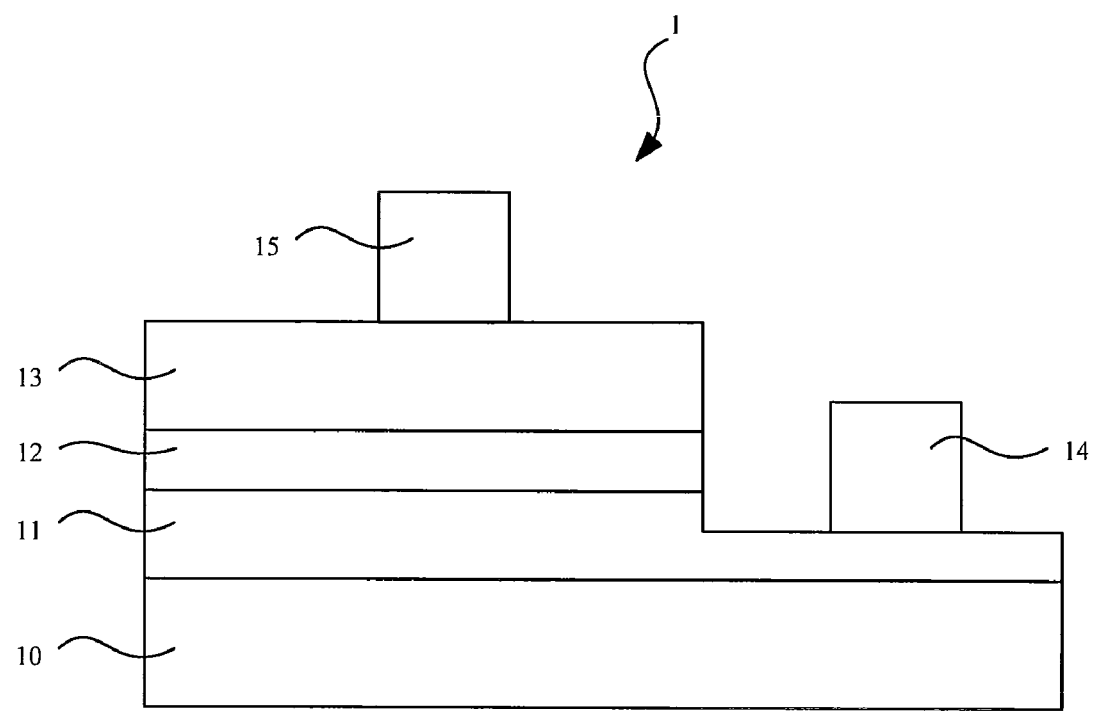
FIG. 1 is a cross-sectional view illustrating a conventional light-emitting diode.
Figure 2A:
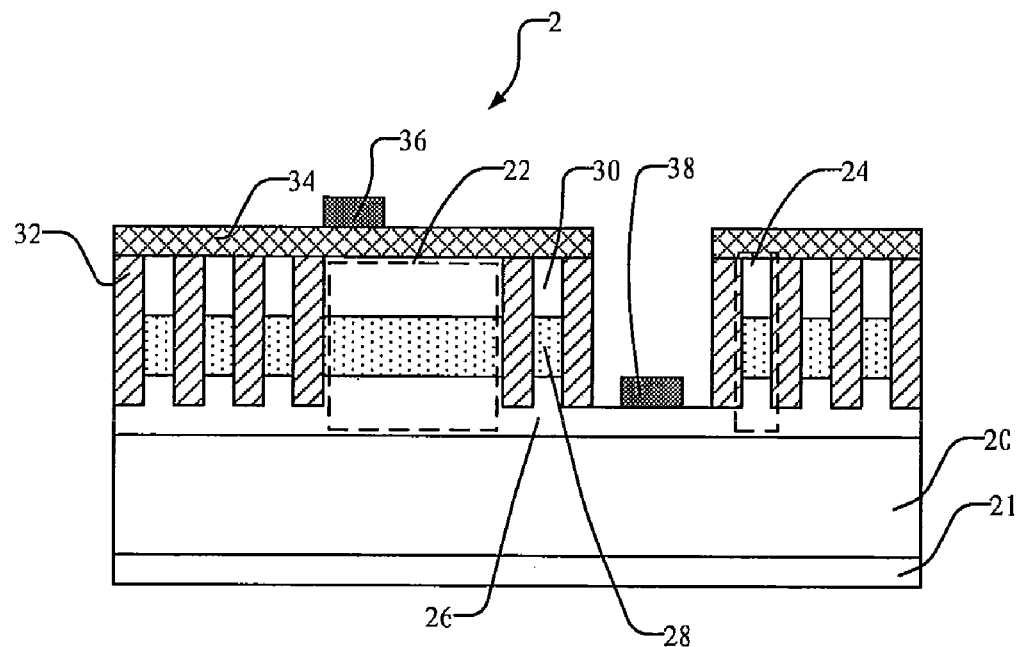
FIG. 2A and FIG. 2B are cross-sectional views illustrating a light-emitting diode according to an embodiment of the invention.

Please refer to FIG. 2A. FIG. 2A is a cross-sectional view illustrating a light-emitting diode 2 according to an embodiment of the invention.

As illustrated in FIG. 2A, the light-emitting diode 2 includes a substrate 20, a main stack structure 22, a plurality of secondary pillars 24, a transparent insulating layer 32, a transparent conducting layer 34, a first electrode 36, and a second electrode 38. Practically, the substrate 20 thereon defines a scribe line and the positions of most of the pillars 24 could be substantially on the scribe line.

The main stack structure 22 is formed on the substrate 20, and the plurality of secondary pillars 24 is formed on the substrate 20 and surrounds the main stack structure 22. The stack structure 22 and each of the plurality of pillars 24 respectively has a first conducting-type semiconductor layer 26, an luminescing layer 28, and a second conducting-type semi-conductor layer 30 formed on the substrate 20 in sequence. The first conducting-type semi-conductor layer 26, the luminescing layer 28, and the second conducting-type semi-conductor layer 30 could be made of a nitride material in practical applications.

As illustrated in FIG. 2A, the transparent insulating layer 32 of the light emitting diode 2 fills the gaps between the pillars 24 and is substantially as high as the pillars 24. Moreover, in a preferred embodiment, the refractive index of the transparent insulating layer 32 is between the refractive index of the air and that of the nitride material. The transparent conducting layer 34 is coated on the main stack structure 22, the plurality of pillars 24 and the transparent insulating layer 32. The first electrode 36 is formed on the transparent conducting layer 34 and the second electrode 38 is formed on the first conducting-type semiconductor layer 26 which is partly uncovered. In a partly uncovered. In a preferred embodiment, the light-emitting diode 2 further includes a reflecting layer 21 formed on a bottom surface of the substrate 20 to make the light-emitting diode 2 to luminesce upward.

Figure 2B:
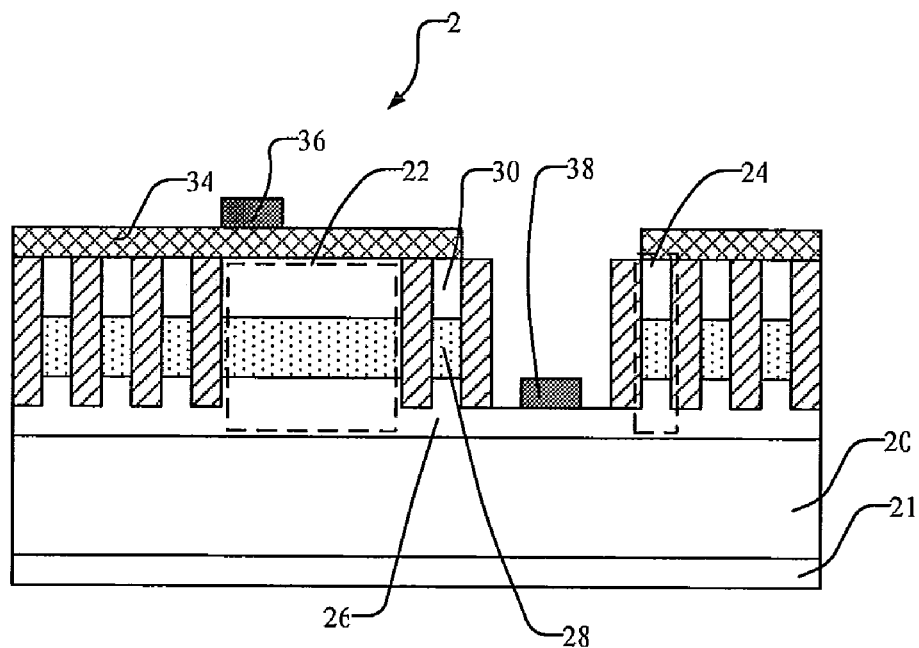

Please refer to FIG. 2B. In another preferred embodiment, a specific area close to the second electrode 38 on the upper surfaces of the main stack structure 22, the plurality of pillars 24, and the transparent insulating layer 32 is not coated with the transparent conducting layer 34 to avoid the second electrode 38 connecting with the transparent conducting layer 34 which may result in short circuit while wiring.

Figure 2C:
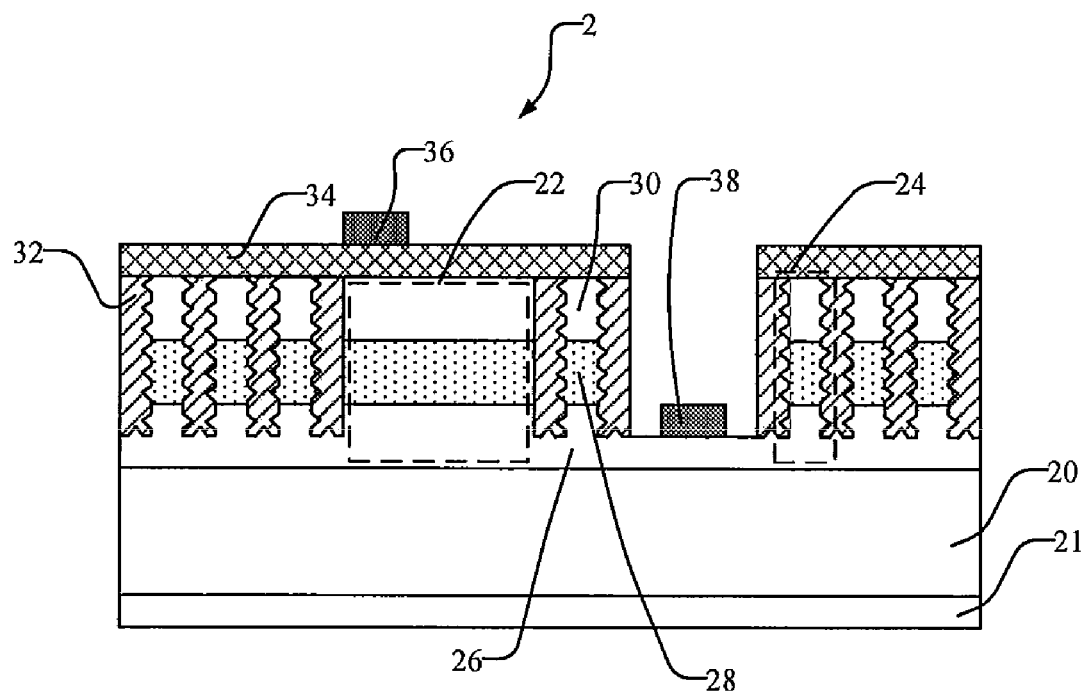
FIG. 2C is a cross-sectional view illustrating the surfaces of the pillars in FIG. 2A are roughed.
Figure 2D:
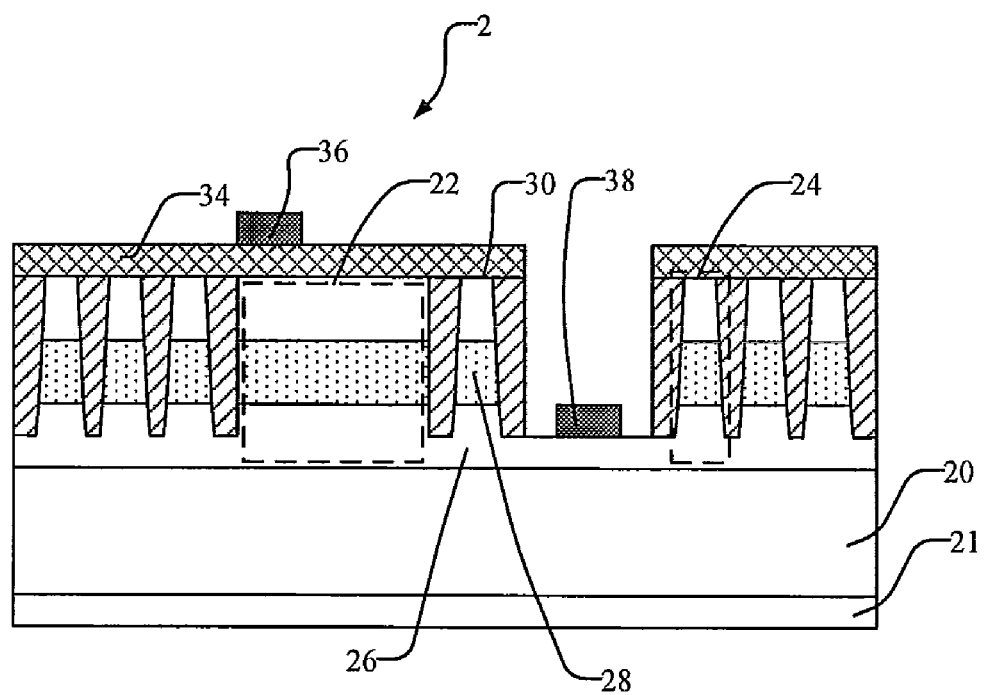
FIG. 2D is a cross-sectional view illustrating the cross sections of the pillars are trapezoid-shaped.

Please notice that the surface outlines of the plurality if pillars 24 could be designed for improving the light-extraction efficiency of the light-emitting diode. In a preferred embodiment, the surfaces of the plurality of pillars 24 and the areas of the plurality of pillars 24, where the first conducting-type semi-conductor layer 26 is disposed, are roughed, as illustrated in FIG. 2C. In another preferred embodiment, the cross sections of the plurality of pillars 24 are trapezoid-shaped, as illustrated in FIG. 2D. In another preferred embodiment, the structures of the plurality of pillars 24 are hollow.

Moreover, in another embodiment, the first electrode 36 of the light-emitting diode 2 is formed on the transparent conducting layer 34 and the second electrode 38 could be formed on the bottom surface of the substrate 20. Please notice that the substrate in the embodiment is made of a conducting material. The advantages of the embodiment is that the luminescing layer need not be partly etched to make part of the upper surface of the first conducting-type semiconductor layer 26 uncovered for disposing an electrode, so that the luminescing area of the light-emitting diode of the embodiment is larger.

Please refer to FIG. 2A, and FIG. 3A to 3F. FIG. 3A to FIG. 3F are a series of cross-sectional views illustrating the fabrication of the light-emitting diode in FIG. 2A according to another embodiment of the invention. The fabricating method is described as the followings.

Figure 3A:
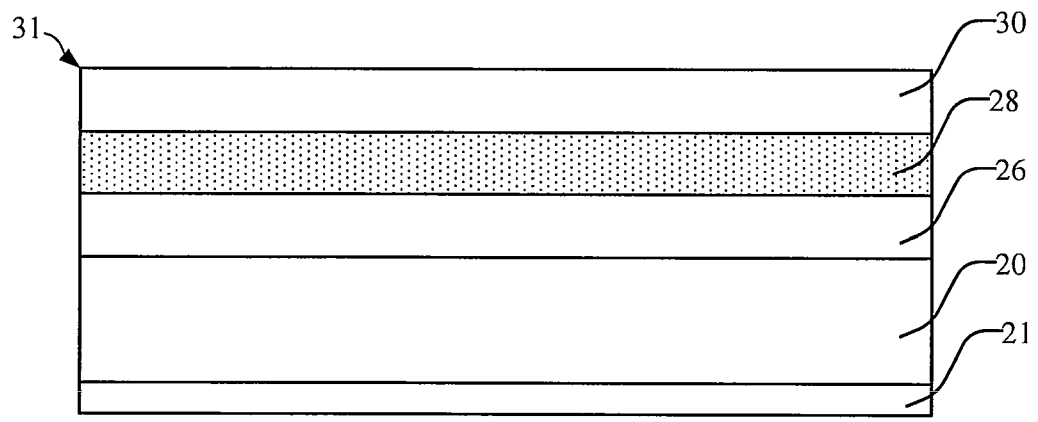
FIG. 3A to FIG. 3F are a series of cross-sectional views illustrating fabricating the light-emitting diode in FIG. 2A according to another embodiment of the invention.

Firstly, as illustrated in FIG. 3A, the first conducting-type semiconductor layer 26, the luminescing layer 28, and the second conducting-type semiconductor layer 30 are formed in sequence on the substrate 20 for preparing a semiconductor stack structure 31. In a preferred embodiment, a reflecting layer 21 is further formed on a bottom surface of the substrate 20 in the method to promote the light-emitting diode 2 to luminesce upward. Please refer to FIG. 3G. FIG. 3G is a top view of the structure in FIG. 3A, the semiconductor stack structure 31 formed on the substrate 20 includes an area of the main position and an area of surrounding part 310 which surrounds said area of the main position, wherein the shadow portion therein represents a surrounding part 310 of the semiconductor stack structure 31 which is an etched area extending along the edge of the substrate 20, and the blank-leaving represents the area of the main position.

Figure 3B:
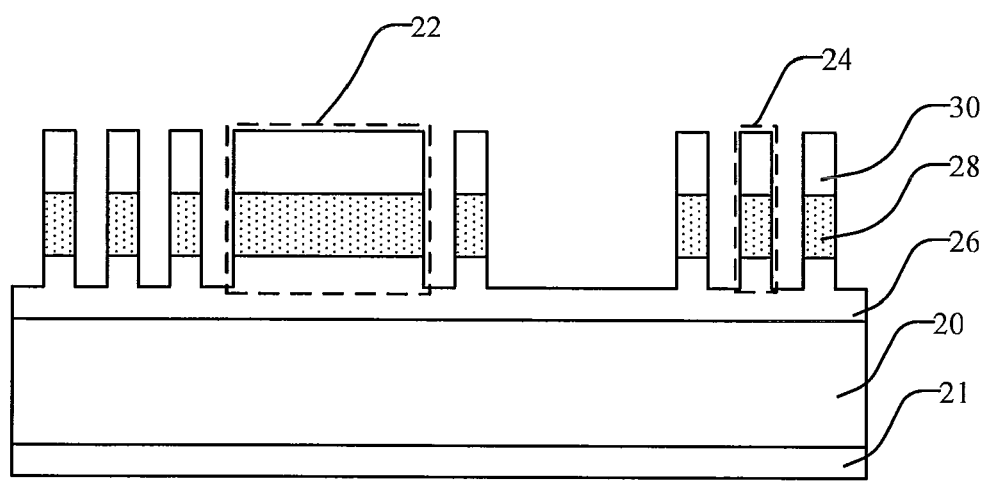
Figure 3C:
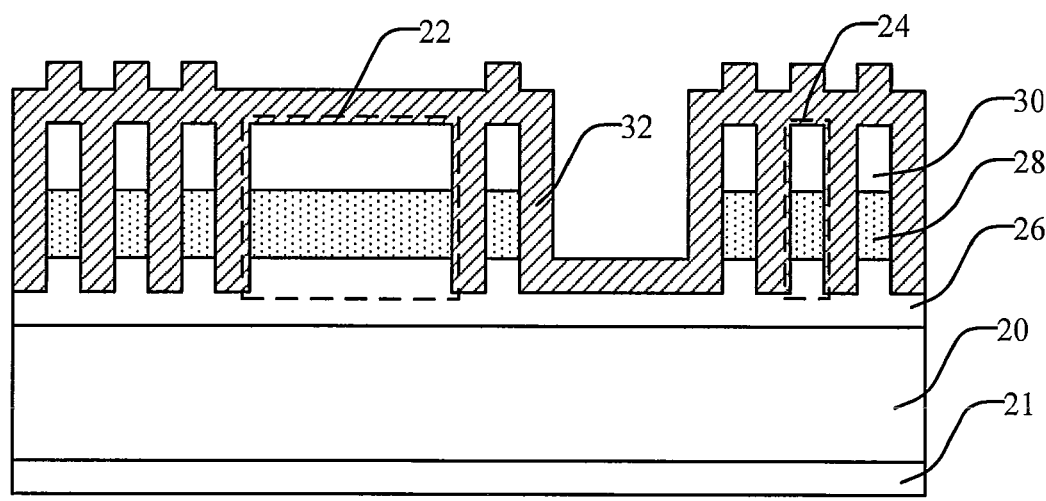
Figure 3D:
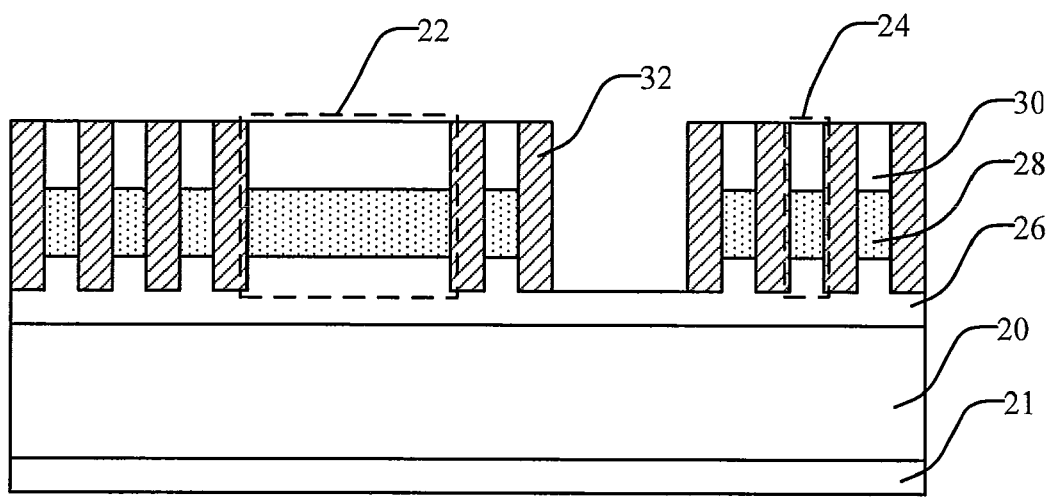
Figure 3E:
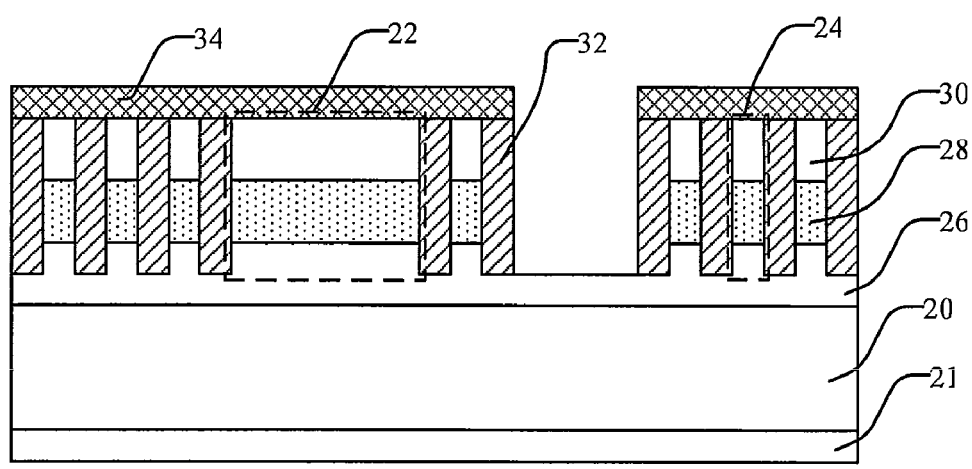
Figure 3F:
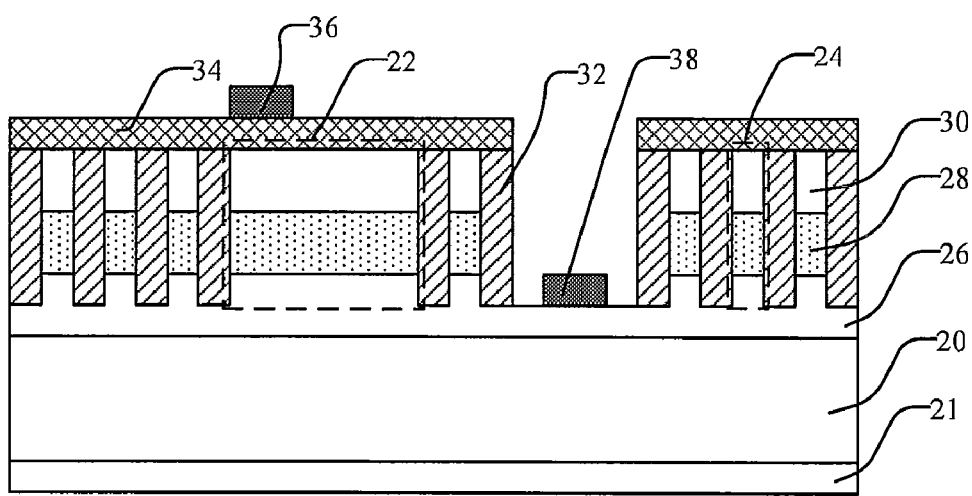
Figure 3G:
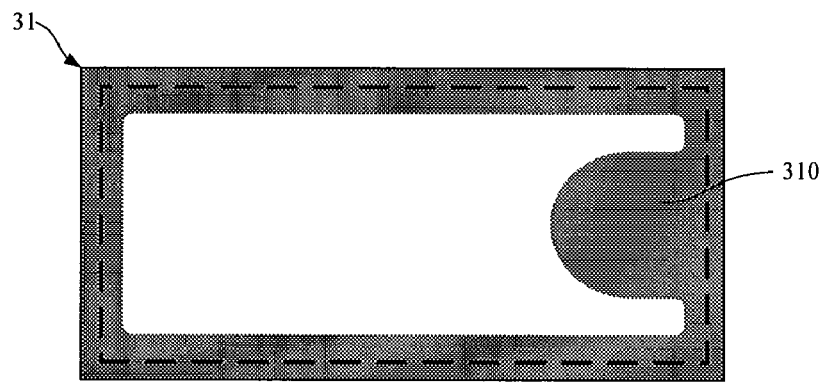
FIG. 3G is a top view of the structure in FIG. 3A.
Figure 3H:
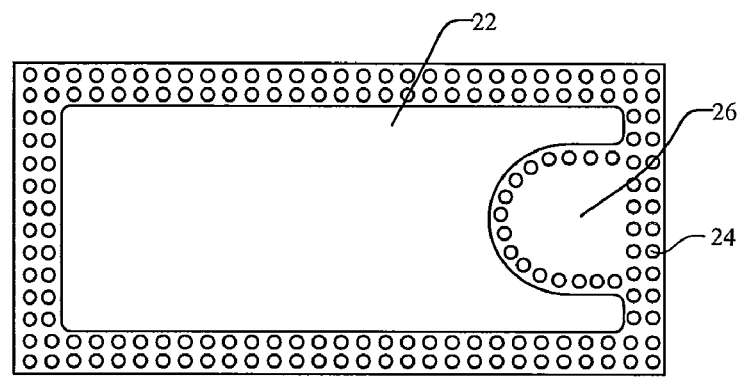
FIG. 3H is a top view of the structure in FIG. 3B.

Subsequently, an etching process is performed on the area of surrounding part 310 of the semiconductor stack structure 31, thus the main stack structure 22 and the pillars 24 locating on the area of surrounding part 310 and surrounding the main stack structure 22 are produced by means of etching the semiconductor stack structure 31, as illustrated in FIG. 3B and FIG. 3H. FIG. 3H is a top view of the structure in FIG. 3B. The plurality of pillars 24 therein could be arranged separately or highly concentrated in a specific position on the area of surrounding part 310. Additionally, the dotted line in FIG. 3G represents the position of the defined scribe line on the substrate 20. Compare FIG. 3G with FIG. 3H, it could be seen that a portion of the pillars formed on the area of surrounding part 310 can be used to define a scribe line substantially surrounding the main stack structure 22, and most of the pillars 24 are substantially adjacent to the scribe line. Accordingly, most of the light emitting area (main stack structure 22) can be remained after the plurality of secondary pillars 24 are formed, and the light-extraction efficiency of the light-emitting diode can be improved by benefiting from the arrangement of those pillars without losing the light emitting area. Moreover, as illustrated in FIG. 3H, part of the upper surface of the first conducting-type semiconductor layer 26 are uncovered after etching and the uncovered part could be used for disposing an electrode.

Figure 3I:
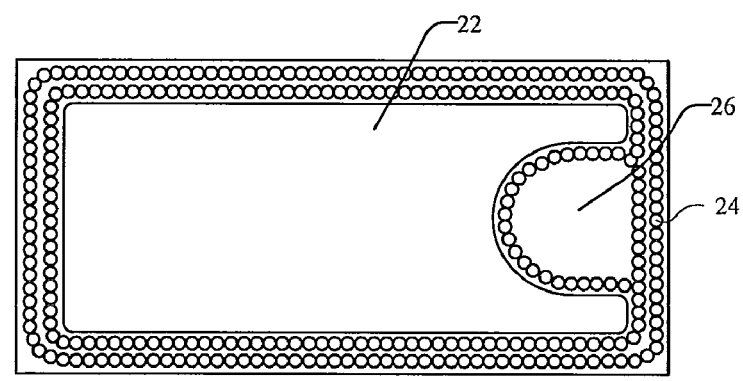
FIG. 3I is a top view illustrating the pillars arrange in a ring with inner and outer circles.

Furthermore, in an embodiment, the plurality of pillars 24 could construct at least a ring to surround the luminescing layer 28 of the main stack structure 22, and each of the rings are constructed from the plurality pillars substantially linked together. As illustrated in FIG. 3I, the pillars 24 are arranged in a ring with inner and outer circles to make sure the pillars lead the light emitted by the luminescing layer 28 of the main stack structure 22 toward the light-outputting surface of the light-emitting diode.

Subsequently, as illustrated in FIG. 3C, the transparent insulating layer 32 is coated on the whole device in FIG. 3B as well as filling the gaps between the pillars 24.

Then as illustrated in FIG. 3D, the method could make use of selective etching method and collocates the planarization process to rid of extra transparent insulating layer 32 to make the transparent insulating layer 32 filling the gaps between the pillars 24 is substantially as high as the pillars 24.

Next, as illustrated in FIG. 3E, the transparent conducting layer 34 is coated on the main stack structure 22, the plurality of pillars 24, and the transparent insulating layer 32.

After that, as illustrated in FIG. 3F, the first electrode 36 is formed on the transparent conducting layer 34 and the second electrode 38 is formed on the partly uncovered first conducting-type semiconductor layer 26, wherein the second electrode 38 is surrounded by the plurality of secondary pillars which are located on the area of surrounding part 310.

Figure 4A:
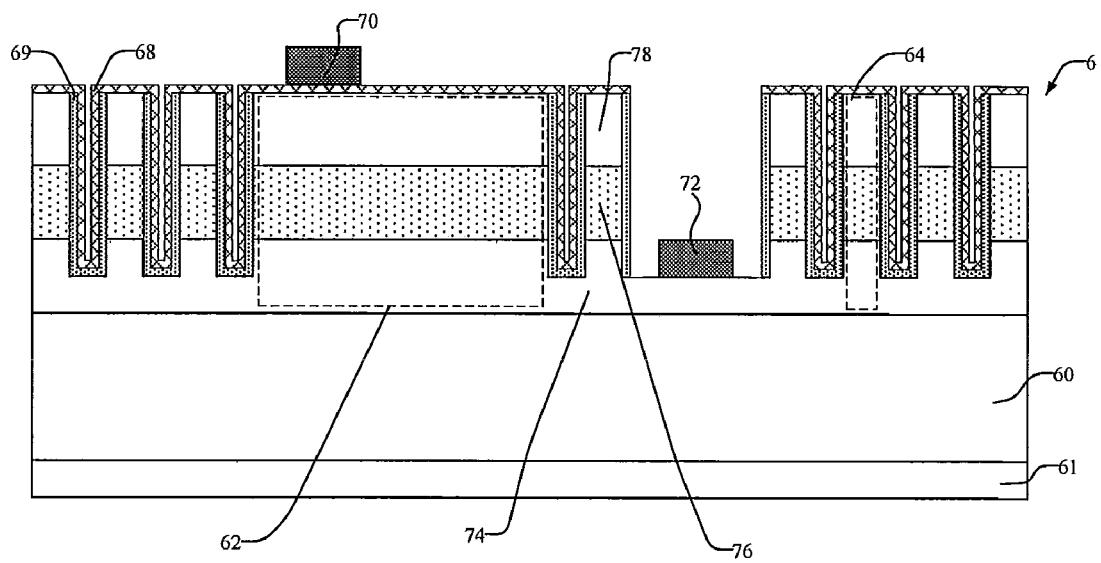
FIG. 4A and FIG. 4B are cross-sectional views illustrating a light-emitting diode according to another embodiment of the invention.

Please refer to FIG. 4A. FIG. 4A is a cross-sectional view illustrating a light-emitting diode 6 according to another embodiment of the invention.

As illustrated in FIG. 4A, the light-emitting diode 6 includes a substrate 60, a main stack structure 62, a plurality of secondary pillars 64, a continuous transparent insulating layer 69, a continuous transparent conducting layer 68, a first electrode 70 and a second electrode 72. Practically, the substrate 60 thereon defines a scribe line and the positions of most of the pillars 64 are substantially on the scribe line.

The main stack structure 62 is formed on the substrate 60, and the plurality of secondary pillars 64 is formed on the substrate 60 and surrounds the main stack structure 62. The main stack structure 62 and each of the plurality of pillars 64 respectively has a first conducting-type semiconductor layer 74, an luminescing layer 76, and a second conducting-type semi-conductor layer 78 formed on the substrate 60 in sequence. The first conducting-type semi-conductor layer 74, the luminescing layer layer 76, and the second conducting-type semi-conductor layer 78 could be made of a nitride material in practical applications.

As illustrated in FIG. 4A, the continuous transparent insulating layer 69 is coated on the upper surface of the first conducting-type semiconductor layer 74 having the plurality of pillars 64, the side surface of the first conducting-type semi-conductor layer 74, the luminescing layer 76, and the second conducting-type semi-conductor layer 78 of the main stack structure 62 and those of the plurality of pillars 64 to make upper surface of the second conducting-type semiconductor layers 78 of the main stack structure 62 and that of each of the pillars 64 uncovered. The continuous transparent conducting layer 68 is coated on the transparent insulating layer 69, the upper surface of the second conducting-type semiconductor layers 78 of the main stack structure 62 and that of each of the plurality of pillars 64 to make the main stack structure 62 and the plurality of pillars 64 conducted to each other.

Please notice that the side surface of the main stack structure 62 and the side surface of each of the second conducting-type semiconductor layers 78 of each of the pillars 64 are not necessary to be completely coated with the transparent insulating layer 69. The point is that the second conducting-type semiconductor layers 78 is uncovered and is capable of conducting with transparent conducting layer 68.

Figure 4B:
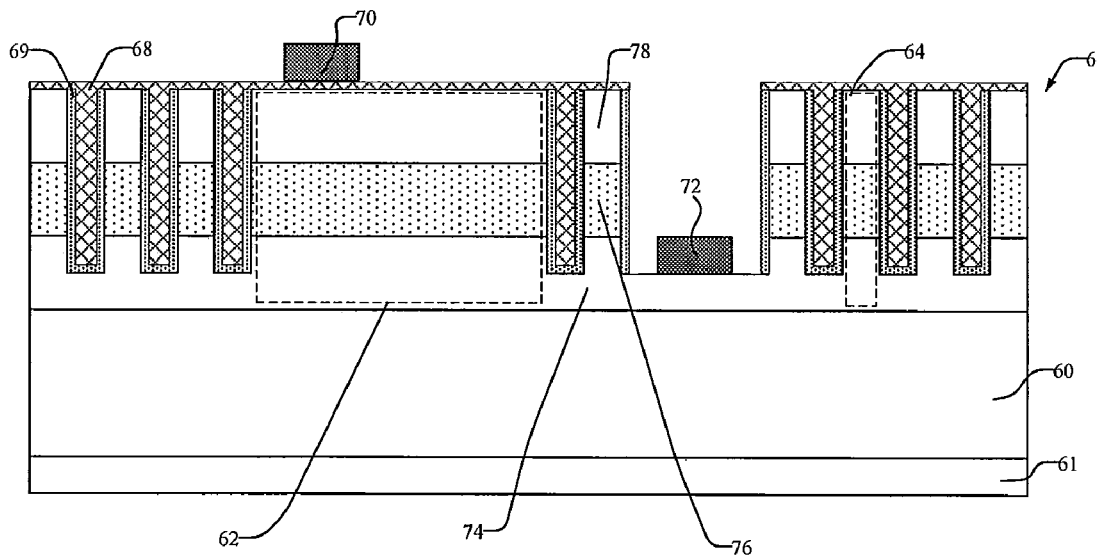

Moreover, in a preferred embodiment, the refractive index of the transparent conducting layer 68 is between the refractive index of the air and that of the nitride material. Particularly, the transparent conducting layer 68 could further fill the gaps between the pillars 64 as shown in FIG. 4B.

The first electrode 70 is formed on the transparent conducting layer 68 and the second electrode 72 is formed on the partly uncovered first conducting-type semiconductor layer 74. In a preferred embodiment, the light-emitting diode 6 further includes a reflecting layer 61 formed on a bottom surface of the substrate 60 to promote the light-emitting diode 6 to luminesce upward.

Please notice that the surface outlines of the plurality if pillars 64 could be designed for improving the light-extraction efficiency of the light-emitting diode. In a preferred embodiment, the surfaces of the plurality of pillars 64 and the areas of the plurality of pillars 64, where the first conducting-type semi-conductor layer 74 is disposed (please refer to FIG. 2C again), are roughed. In another preferred embodiment, the cross sections of the plurality of pillars 64 are trapezoid-shaped (please refer to FIG. 2D again). In another preferred embodiment, the structures of the plurality of pillars 64 are hollow.

Moreover, in another embodiment, the first electrode 70 of the light-emitting diode 6 is formed on the transparent conducting layer 68 and the second electrode 72 could be formed on be bottom surface of the substrate 60. Please notice that the substrate in the embodiment is made of a conducting material. The advantages of the embodiment is that the luminescing layer need not be partly etched to make part of the upper surface of the first conducting-type semiconductor layer uncovered for disposing an electrode, so that the luminescing area of the light-emitting diode of the embodiment is larger.

Please refer to FIG. 5A to 5E. FIG. 5A to FIG. 5E are a series of cross-sectional views illustrating the fabrication of the light-emitting diode 6 according to another embodiment of the invention. The fabricating method is described as the followings.

Figure 5A:
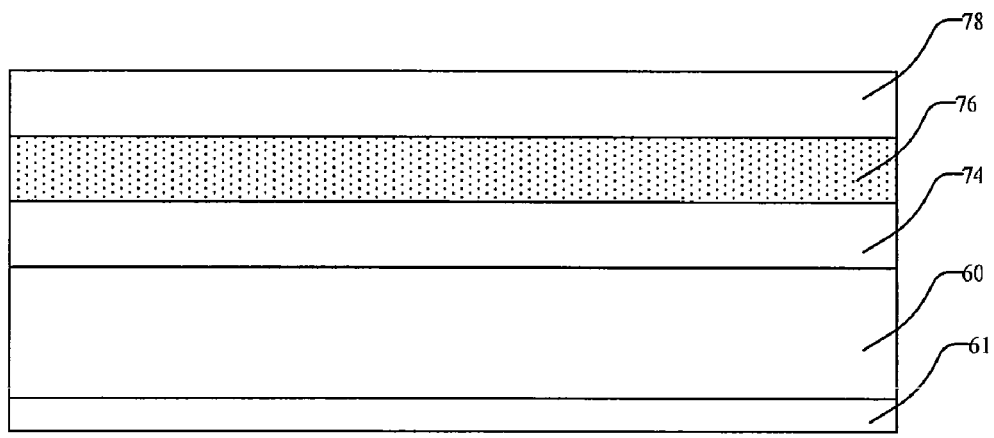
FIG. 5A to FIG. 5E are a series of cross-sectional views illustrating fabricating the light-emitting diode in FIG. 4A according to another embodiment of the invention.

Firstly, as illustrated in FIG. 5A, the first conducting-type semiconductor layer 74, the luminescing layer 76, and the second conducting-type semiconductor layer 78 are formed in sequence on the substrate 60 for preparing a semiconductor stack structure. In a preferred embodiment, a reflecting layer 61 is further formed on a bottom surface of the substrate 60 in the method to promote the light-emitting diode 2 to luminesce upward.

Figure 5B:
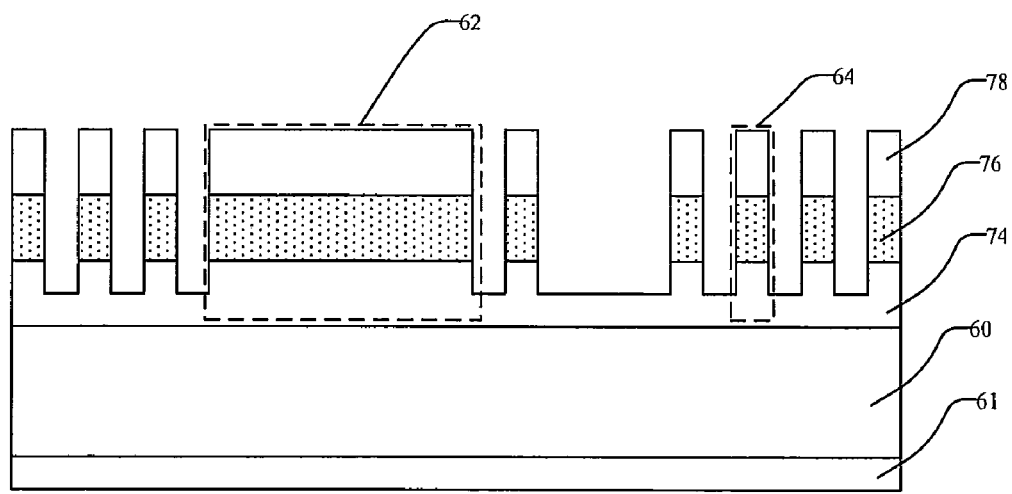

Subsequently, a etching process is performed on the surrounding part of the semiconductor stack structure as illustrated in FIG. 5B, thus the main stack structure 62 and the pillars 64 locating on the surrounding part and surrounding the main stack structure 62 are produced by means of etching the semiconductor stack structure. The arrangement on the surrounding part is shown as FIG. 3G.

Please refer to FIG. 3H again. In an embodiment, the plurality of pillars 64 could be arranged separately or highly concentrated in a specific position on the surrounding part. Furthermore, please refer to FIG. 3I again. In an embodiment, the plurality of pillars 64 could construct at least a ring to surround the luminescing layer 76 of the main stack structure 62, and each of the rings are constructed from the plurality pillars substantially linked together.

Figure 5C:
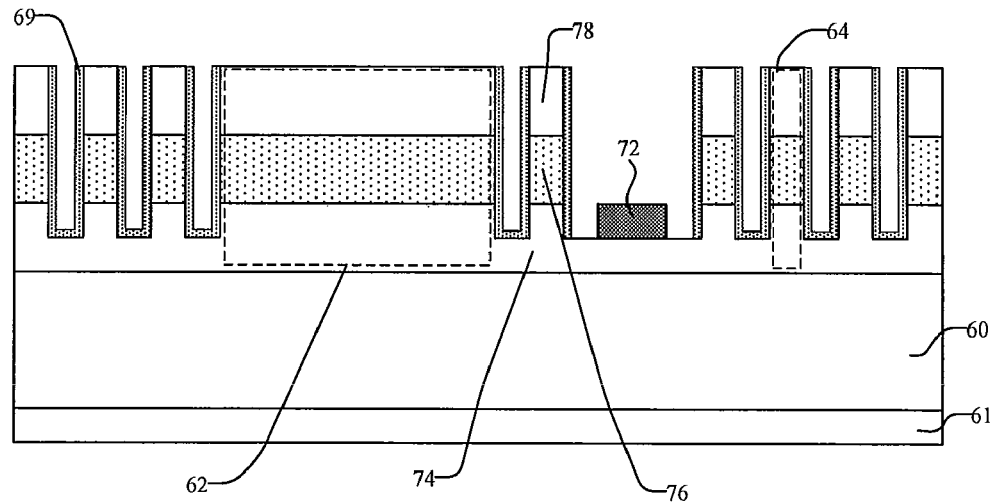

Subsequently, as illustrated in FIG. 5C, the continuous transparent insulating layer 69 is coated on the upper surface of the first conducting-type semiconductor layer 74 of the plurality of pillars 64, the side surface of the first conducting-type semiconductor layer 74, the luminescing layer 76, and the second conducting-type semiconductor layer 78 of the main stack structure 62 and that of the plurality of pillars 64.

Figure 5D:
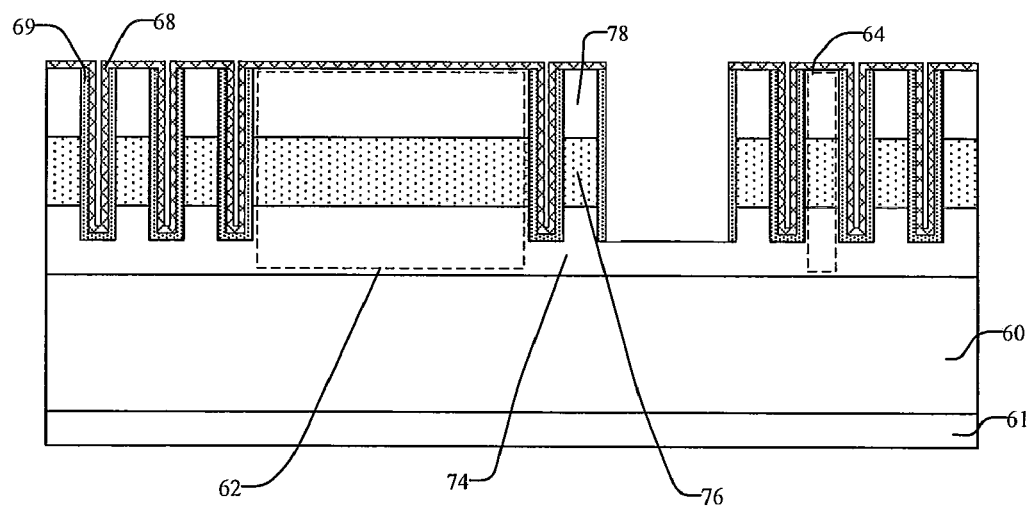
Figure 5E:
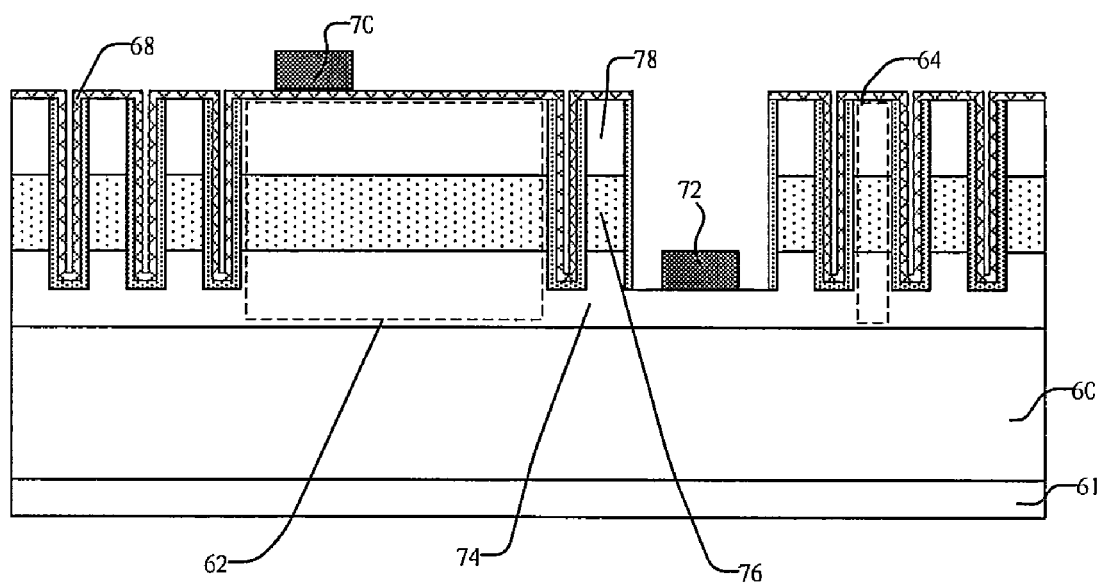

Then as illustrated in FIG. 5D, the continuous transparent conducting layer 68 is coated on the continuous transparent insulating layer 69, the upper surface of the second conducting-type semiconductor layer 78 of the main stack structure 62 and that of the plurality of pillars 64. Particularly, the continuous transparent conducting layer 68 could further fill the gaps between the pillars 64 is as shown in FIG. 4B.

Finally, as illustrated in FIG. 3E, the first electrode 70 is formed on the continuous transparent conducting layer 68, and the second electrode 72 is formed on the partly uncovered first conducting-type semiconductor layer 74.

Compared to the prior art, the light-emitting diode of the invention includes the plurality of pillars as mentioned above, therefore the light-extraction efficiency of the light-emitting diode is improved. Furthermore, filling the transparent insulating layer with high refractive index into the gaps between the pillars could not only decrease the total reflection phenomenon of the light in the light-emitting diode but also increase the fracture resistance of the device. Otherwise, the pillars are coated with the transparent conducting layer, which makes the driving current of the light-emitting diode to flow to the pillars to promote the luminescing layers of the pillars to luminesce without losing the luminescing area of the pillars.

Although the present invention has been illustrated and described with reference to the preferred embodiment thereof, it should be understood that it is in no way limited to the details of such embodiment but is capable of numerous modifications within the scope of the appended claims.

What is claimed is:

1. A light-emitting diode device with high luminescent efficiency comprising:
    a substrate;
    a semiconductor stack structure formed on the substrate, wherein the semiconductor stack structure includes an area of the main position and an area of surrounding part which surrounds said area of the main position;
    a main stack structure formed on the area of the main position;
    a plurality of secondary pillars formed on the area of surrounding part, wherein the main stack structure and each of the secondary pillars respectively have a first conducting-type semiconductor layer, a luminescing layer, and a second conducting-type semiconductor layer formed on the substrate in sequence, and each of the secondary pillars has a size less than that of the main stack structure;
    a transparent insulating layer filling the gaps between the plurality of secondary pillars;
    a transparent conducting layer coated on the main stack structure, the plurality of secondary pillars and the transparent insulating layer;
    a first electrode formed on the transparent conducting layer and located in the area of main position; and
    a second electrode formed on the area of surrounding part, wherein the second electrode is surrounded by the plurality of secondary pillars;
    wherein both the area of main position and the area of surrounding part are luminescing areas.

2. The light-emitting diode device with high luminescent efficiency of claim 1, wherein the surrounding part is an etched area on which a scribe line substantially surrounding the main stack structure is defined by a portion of the plurality of secondary pillars.

3. The light-emitting diode device with high luminescent efficiency of claim 1, wherein the first conducting-type semiconductor layer, the luminescing layer, and the second conducting-type semi-conductor layer are all made of a nitride material.

4. The light-emitting diode device with high luminescent efficiency of claim 3, wherein the refractive index of the transparent insulating layer is between the refractive index of the air and that of the nitride material.

5. The light-emitting diode device with high luminescent efficiency of claim 1, further comprising a reflecting layer formed on a bottom surface of the substrate.

6. The light-emitting diode device with high luminescent efficiency of claim 1, wherein the surfaces of the plurality of pillars and the areas of the plurality of secondary pillars, where the first conducting-type semi-conductor layer is disposed, are roughed.

7. The light-emitting diode device with high luminescent efficiency of claim 1, wherein the cross sections of the plurality of pillars are trapezoid-shaped.

8. The light-emitting diode device with high luminescent efficiency of claim 1, wherein the plurality of secondary pillars are hollow structures.

9. The light-emitting diode device with high luminescent efficiency of claim 1, wherein the plurality of secondary pillars construct at least a ring to surround the main stack structure, and each of the rings are constructed from the plurality of secondary pillars substantially linked together.

10. The light-emitting diode device with high luminescent efficiency of claim 1, wherein the transparent insulating layer fills the gaps between the plurality of secondary pillars and is substantially as high as the secondary pillars.

11. The light-emitting diode device with high luminescent efficiency of claim 1, wherein the second electrode is formed on the first conducting-type semiconductor layer which is partly uncovered.

12. A light-emitting diode device with high luminescent efficiency comprising:
    a substrate having a surrounding part;
    a main stack structure formed on the substrate;
    a plurality of secondary pillars formed on the substrata to surround the main stack structure, wherein the main stack structure and each of the pillars respectively have a first conducting-type semiconductor layer, a luminescing layer, and a second conducting-type semiconductor layer formed on the substrate in sequence;
    a transparent insulating layer filling the gaps between the secondary pillars; and
    a transparent conducting layer coated on the main stack structure, the secondary pillars and the transparent insulating layer, wherein each of the secondary pillars has an uneven side surface whereas the main stack structure has even side surface.

* * * * *